(12) United States Patent
Novotny

(10) Patent No.: US 8,240,165 B2
(45) Date of Patent: Aug. 14, 2012

(54) LIQUID COOLING CIRCUITS AND METHOD FOR ELECTRICAL CABINETS, DRAWERS, BAYS, MODULES, CIRCUIT BOARDS AND ELECTRICAL COMPONENTS USING QUICK-DISCONNECT FITTINGS FOR INTERFACING TO A HOST COOLING SOURCE

(75) Inventor: Shlomo Novotny, Wayland, MA (US)

(73) Assignee: VETTE Corp., Portsmouth, NH (US)

( * ) Notice: Subject to any disclaimer, the term of this patent is extended or adjusted under 35 U.S.C. 154(b) by 1055 days.

(21) Appl. No.: 12/178,792

(22) Filed: Jul. 24, 2008

(65) Prior Publication Data

US 2009/0071636 A1    Mar. 19, 2009

Related U.S. Application Data

(60) Provisional application No. 60/972,034, filed on Sep. 13, 2007.

(51) Int. Cl.
  F25D 23/12    (2006.01)
  H05K 5/00    (2006.01)
  F28D 1/06    (2006.01)
  F28D 15/00    (2006.01)
  F28F 7/00    (2006.01)
  F28F 27/02    (2006.01)

(52) U.S. Cl. .......... 62/259.2; 165/75; 165/77; 165/80.4; 165/103; 165/104.31; 165/104.33; 454/184

(58) Field of Classification Search .......... 165/42, 165/47, 53, 70, 72, 75–77, 80.1–80.5, 103, 165/104.22, 104.25, 104.28, 104.31, 104.33, 165/145; 62/259.1, 259.2; 454/184
See application file for complete search history.

(56) References Cited

U.S. PATENT DOCUMENTS

| | | | | |
|---|---|---|---|---|
| 4,354,359 A | * | 10/1982 | Hall et al. | 62/299 |
| 5,743,102 A | * | 4/1998 | Thomas et al. | 62/185 |
| 6,497,110 B2 | * | 12/2002 | Davidson et al. | 62/259.2 |
| 6,587,343 B2 | | 7/2003 | Novotny et al. | |
| 6,807,056 B2 | | 10/2004 | Kondo et al. | |
| 6,828,675 B2 | * | 12/2004 | Memory et al. | 257/714 |
| 7,012,807 B2 | | 3/2006 | Chu et al. | |
| 7,106,590 B2 | | 9/2006 | Chu et al. | |
| 7,385,810 B2 | | 6/2008 | Chu et al. | |

* cited by examiner

*Primary Examiner* — Ljiljana Ciric
*Assistant Examiner* — Travis Ruby
(74) *Attorney, Agent, or Firm* — Brinks Hofer Gilson & Lione

(57) ABSTRACT

A system and method for cooling heat generating components including an electronics cooling circuit loop having a liquid heat exchanger separable from a main liquid cooling circuit manifold by quick-disconnect fittings. This supports the use of different liquids in the electronics subsystem cooling circuit loop and in the main liquid manifold of the master cooling circuit. Also included are two phase loops and an optional compressor.

18 Claims, 4 Drawing Sheets

LIQUID COOLING CIRCUITS AND METHOD FOR ELECTRICAL CABINETS, DRAWERS, BAYS, MODULES, CIRCUIT BOARDS AND ELECTRICAL COMPONENTS USING QUICK-DISCONNECT FITTINGS FOR INTERFACING TO A HOST COOLING SOURCE

RELATED APPLICATIONS

This application claims the benefit of U.S. Provisional Application No. 60/972,034, filed Sep. 13, 2007; this application is herein incorporated in its entirety by reference.

FIELD OF THE INVENTION

The invention relates to systems for cooling heat generating components, and more particularly, to a closed cooling circuit loop having a heat exchanger separable from a main or host liquid cooling circuit manifold by quick-disconnect fittings. This supports the use of different liquids in the electronics subsystem cooling circuit loop and in the main liquid manifold of the master cooling circuit. Also included are two phase loops and an optional refrigeration compressor.

BACKGROUND OF THE INVENTION

Liquid cooling of electronics cabinets to control heat rise is well documented and widely used. It may be scaled up or down from cooling internal cabinet air generally with liquid/air heat exchangers to direct cooling of specific components with cool plates or internal fluid flow cavities. It is used for its relatively greater thermal capacity over common air mover designs.

Electronics components or the drawers, bays or modules in which they reside, must be removable and replaceable, preferably without the need to power down other circuits or systems that may be co-resident in the same cabinet and sharing a common cooling system. Various means for interfacing closed fluid cooling loops that service these removable heat-generating components have been tried. These removable heat-generating components can include drawers, bays, modules, or circuit boards in the cabinet. Cooling means can also include closed master liquid cooling systems for efficient thermal transfer. Those disclosed include contacting thermal plates between the service fluid cooling loops and the master fluid cooling loop.

SUMMARY OF THE INVENTION

However, setting aside the requirement for disconnecting and removing drawers or modules from the cabinet, and opening the back panel for access, and all other things being equal, the thermal transfer characteristics of a direct, liquid/liquid heat exchanger provides greater performance potential and greater cooling capacity than a liquid to air heat exchanger. To that end, the Applicant has developed a system for in-cabinet interfacing of closed fluid cooling loops. They are incorporated or integrated with removable electronics drawers, bays, modules or components. The loops interface with a closed host or master fluid cooling loop. The host or master fluid cooling loop includes a liquid/liquid heat exchanger located in the back of the cabinet. The exchanger is optionally as part of the back panel. The exchanger is the principal thermal transfer component for removing heat from the closed service loops to the master cooling circuit. Either loop can be a single or two phase loop, optionally using a compressor in a refrigeration loop instead of a pump.

In one aspect, the closed cooling loop of the respective removable bay, drawer, module or component includes inlet and outlet quick-disconnects between its heat delivery coil in the liquid/liquid heat exchanger and the remainder of its cooling circuit. The act of opening the back panel, or a partial removal of a bay, drawer, module or component while still under power, opens the quick-disconnect and closes off the lines connecting the respective cooling circuit to its heat delivery coil in the liquid/liquid heat exchanger. In one embodiment, a bypass line on the service loop, inboard of the quick-disconnects, provides an alternate path for the service loop cooling fluid, which continues to circulate via a respective service loop pump, through an on-board fluid/air heat exchanger, so as to continue cooling of the component of interest for a limited period of time, until the bay, drawer, module or component is fully re-engaged or the panel back is closed and the normal connections and coolant flow channels to the heat delivery coil in the liquid/liquid heat exchanger are re-established.

Embodiments include a cooling system for an electronics cabinet comprising at least one fluid closed-loop cooling circuit serving at least one heat generating component within an electronics cabinet; a closed-loop heat exchanger in at least one closed-loop cooling circuit; a fluid-fluid heat exchanger in a host cooling circuit; the fluid-fluid heat exchanger is connected by quick-disconnect fittings to at least one closed-loop cooling circuit, the fluid-fluid heat exchanger supporting heat transfer between the fluid of at least one closed-loop cooling circuit and the host cooling circuit; and supply and return fluid flow lines connected to the fluid-fluid heat exchanger through which cooling fluid is shunted through at least one closed-loop cooling circuit when the quick-disconnect fittings are open. In embodiments, the closed-loop cooling circuit uses a two phase coolant and is configured with a thermally conductive interface with at least one heat generating component and with supply and return fluid flow lines. The cooling system can comprise at least one fluid pump. In further embodiments, the cooling system comprises a compressor.

In yet further embodiments, the quick-disconnect fitting is associated with one closed-loop cooling circuit line end and a host cooling circuit line end, each quick-disconnect fitting configured for closing its associated line end to fluid flow upon disconnecting and opening the associated line end to fluid flow upon reconnecting.

Embodiments include the fluid-fluid heat exchanger of the host cooling circuit arranged proximate a back side of the electronics cabinet so as to be movable for providing access to the interior of the cabinet. In other embodiments, the quick-disconnect fittings are arranged such that front removal of at least one heat generating component operates to disconnect the host cooling circuit from at least one closed-loop cooling circuit.

In accordance with another aspect of the present invention, the quick-disconnect fittings are arranged such that moving the fluid-fluid heat exchanger operates to disconnect the host cooling circuit from at least one closed-loop cooling circuit. The quick-disconnect fittings are arranged such that either of front removal of at least one heat generating component or moving of the fluid-fluid heat exchanger operates to disconnect the host cooling circuit from at least one closed-loop cooling circuit. Each of the closed-loop cooling circuits comprises a closed-loop heat exchanger.

In other embodiments, one closed-loop heat exchanger serves multiple closed-loop cooling circuits. The closed-loop heat exchanger cools fluid passing through the closed-loop heat exchanger when ambient cabinet air is cooler than the fluid and cools the ambient cabinet air when the fluid is cooler than the ambient air. The quick-disconnect fitting limits or prevents leakage of fluid upon disconnection and connection. In an embodiment, the cooling fluid is shunted through a bypass line when the quick-disconnect fittings are open, whereby fluid flow in the closed-loop cooling circuit is maintained.

Yet another embodiment includes a method for cooling an electronics cabinet, the method comprising providing a heat exchange assembly configured to cool at least one heat generating component wherein the heat exchange assembly comprises at least one fluid closed-loop cooling circuit serving at least one heat generating component within an electronics cabinet; a closed-loop heat exchanger in at least one closed-loop cooling circuit; a fluid-fluid heat exchanger in a host cooling circuit; the fluid-fluid heat exchanger connected by quick-disconnect fittings to at least one closed-loop cooling circuit, the fluid-fluid heat exchanger supporting heat transfer between the fluid of at least one closed-loop cooling circuit and the host cooling circuit; and supply and return fluid flow lines connected to the fluid-fluid heat exchanger through which cooling fluid is shunted through at least one closed-loop cooling circuit when the quick-disconnect fittings are open; and wherein when in operation, the closed-loop cooling circuit functions after disconnection of the fluid-fluid heat exchanger thereby providing cooling to at least one heat generating component.

In accordance with yet another aspect of the present invention, each quick-disconnect fitting is associated with a closed-loop cooling circuit line end and a host cooling circuit line end, each quick-disconnect fitting closing its associated line end to fluid flow upon disconnecting and opening the associated line end to fluid flow upon reconnecting. The quick-disconnect fittings are arranged such that either of front removal of at least one heat generating component or moving of the fluid-fluid heat exchanger operates to disconnect the host cooling circuit from at least one closed-loop cooling circuit. The cooling fluid is shunted through a bypass line when the quick-disconnect fittings are open, whereby fluid flow in the closed-loop cooling circuit is maintained. In embodiments, the fluid-fluid heat exchanger of the host cooling circuit is arranged proximate a back side of the electronics cabinet so as to be movable for providing access to the interior of the cabinet.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The invention is susceptible of many embodiments. What follows is illustrative, but not exhaustive of the scope of the invention.

Figure 1:
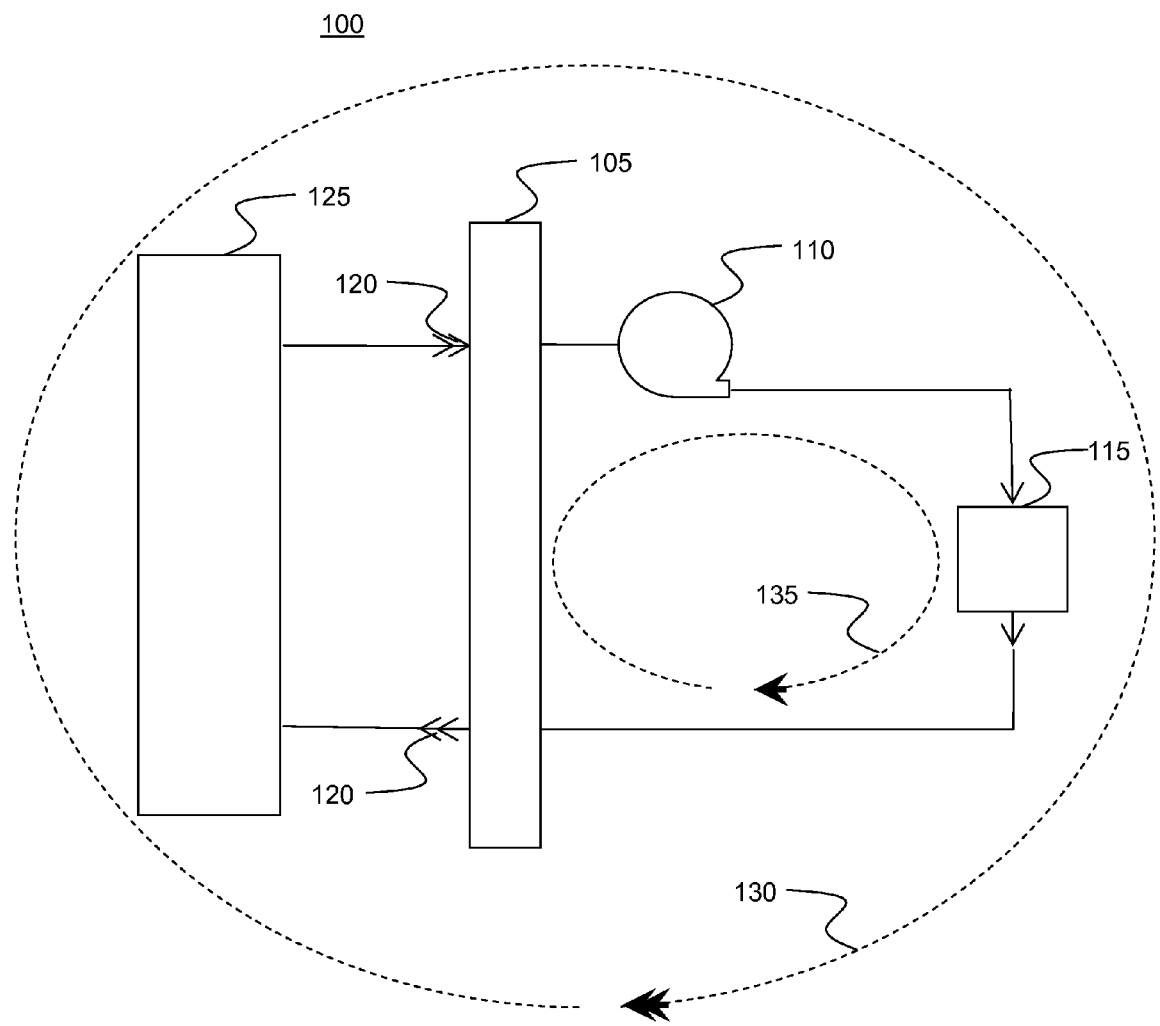
FIG. 1 is a representative schematic diagram of one embodiment of the invention, illustrating one pump or compressor and a heat exchanger in a single one or two phase loop fluid cooling circuit connected via quick-disconnects to a heat exchanger master cooling circuit configured in accordance with an embodiment of the invention.

FIG. 1 illustrates a schematic of an embodiment 100 with a liquid to liquid heat exchanger 105 and a pump 110 in a cooling circuit loop. In various embodiments the pump 110 could be replaced by a compressor and either loop can be a single or two phase loop. Heat exchanger 105 may include components such as a condenser and the loop could be a refrigeration loop. Power may be disconnected when electronics subsystem/module/board 115 is removed. The liquid to liquid heat exchanger 105 includes quick-disconnects 120 to disconnect the cooling circuit loop from a main liquid manifold 125 of the master cooling circuit. The main or master cooling circuit loop can be pumped or a refrigerator loop. This configuration can support the use of different liquids in the electronics subsystem cooling circuit loop and in the main liquid manifold 125 of the master cooling circuit. For example, the cooling circuit loop can use a dielectric coolant while the master cooling circuit uses a liquid including water. The cooling circuit could also use a two phase coolant. The liquid to liquid heat exchanger 105 can have multiple embodiments. For example, the liquid to liquid heat exchanger 105 can include plates, tubes, a condenser, or other thermally conductive arrangements. Disconnecting the cooling circuit loop seals off flow at disconnect nipples 120, allowing continued operation of the master cooling circuit and controlling liquid leakage from either the master cooling circuit or the cooling circuit loop. Coolant flow through the main or master cooling circuit is shown by dashed loop 130. Coolant flow through the closed-loop cooling circuit is shown by dashed loop 135.

Figure 2:
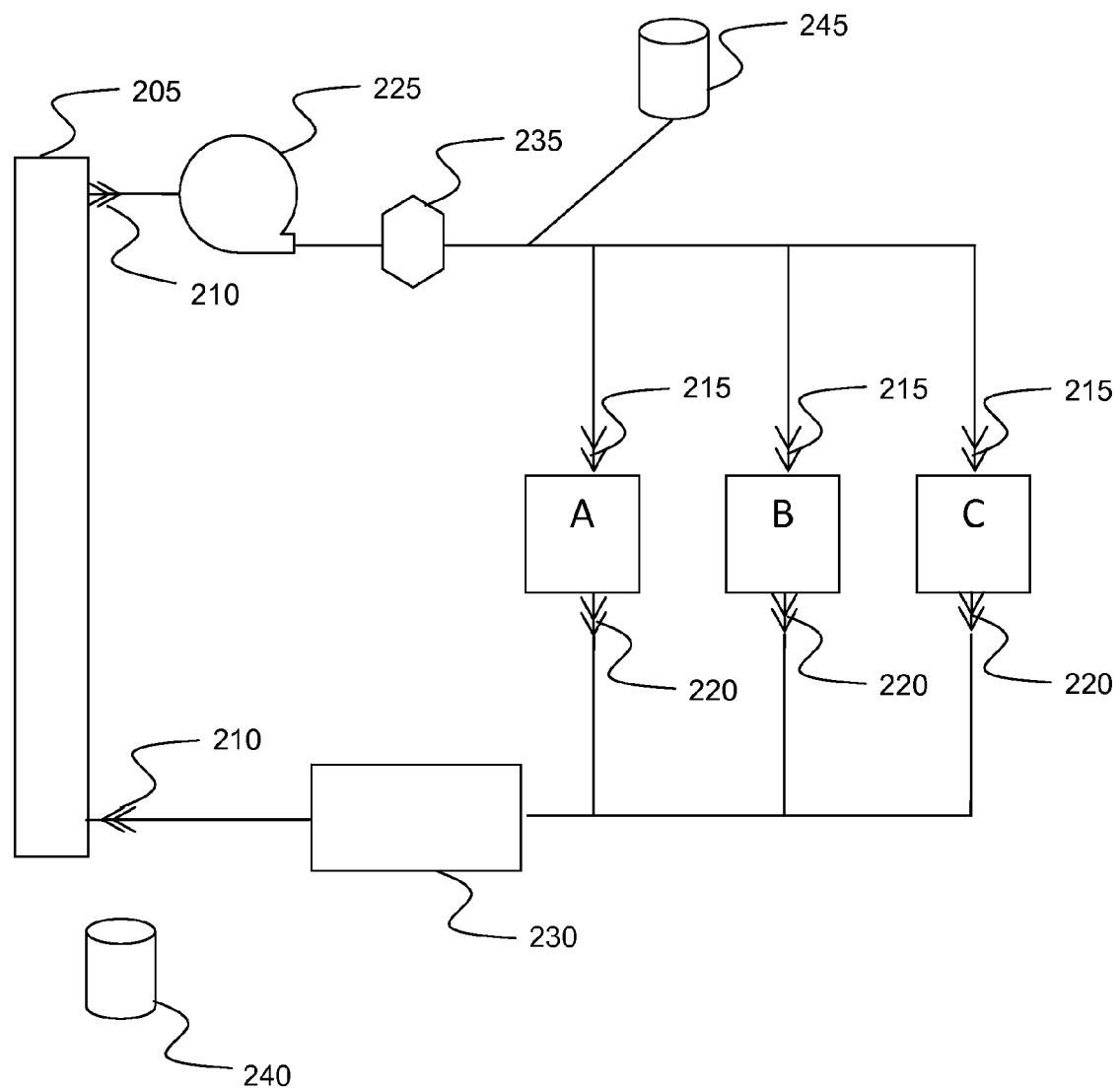
FIG. 2 is a representative schematic diagram of one embodiment of the invention, illustrating a single bay, three component closed-loop fluid cooling circuit connected via quick-disconnects to a heat exchanger master cooling circuit configured in accordance with an embodiment of the invention. Each component being configured with sealing disconnects and the closed loop including a fluid/air heat exchanger for temporary cooling when disconnected from the liquid/liquid heat exchanger master cooling circuit. Either loop can be a single or two phase loop, and optionally instead of a pump, using a compressor and a refrigeration loop.

FIG. 2 illustrates an embodiment 200 including a master heat exchanger 205 attached to a cooling circuit by disconnect line fittings 210. A bypass line (not shown) may optionally be connected between the disconnects 210 to provide an alternate circulation path when the cooling circuit is disconnected from the master cooling circuit. The cooling circuit includes at least one component, drawer, or bay depicted by A, B, and C. One or more of these components may be removed from the cooling circuit by inflow disconnect fittings 215 and outflow disconnect fittings 220. Optional or alternative coolant pump 225 provides fluid flow through components remaining in the cooling circuit. A second level heat exchanger 230 can provide two functions when configured as a liquid/air heat exchanger. One, it can cool the fluid passing through it when the ambient air is cooler than the fluid. Two, it can cool the ambient cabinet air when the fluid is cooler than the ambient air. Exchanger 230 can also be configured as a liquid/liquid heat exchanger in another embodiment. Exchanger 230 can be located at various points in the closed-loop circuit. For example, in the inlet or in the return lines. Optionally, any cooling circuit may include an air trap 235 at any point in a cooling circuit. One or more fluid traps or drainage channels 240 may be included. Where practical, this provision could be placed beneath connectors to contain fluid from and potentially restore fluid to the circulatory system. A coolant reservoir 245 may be employed in conjunction with coolant recovery provisions or generally in any cooling circuit.

The quick-disconnect fittings and any hardware or structure to which they may be rigidly attached are arranged such that either front removal of the respective electronic component, or moving or opening of the heat exchanger, or of the back panel to which it may be attached, operates to disconnect the heat delivery coils from respective fluid cooling circuits, whereby continuing fluid flow in the cooling circuit must depend on the availability of the bypass line.

Figure 3:
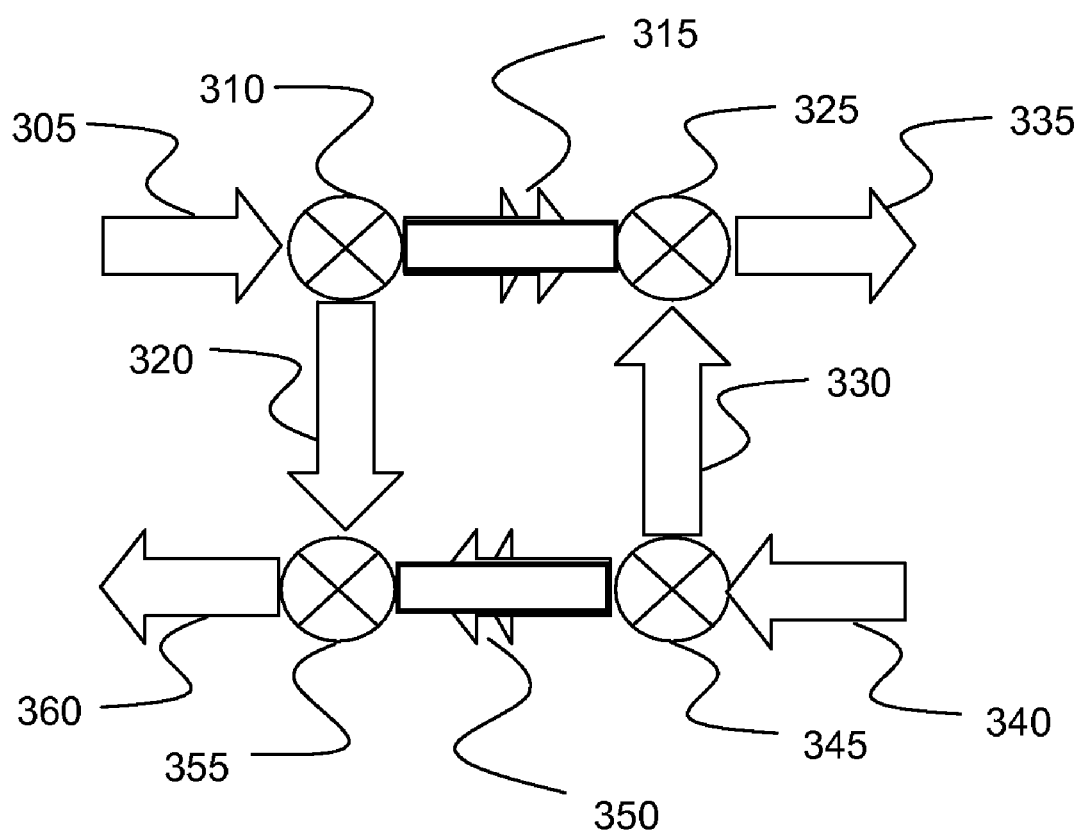
FIG. 3 is a representative schematic diagram of one embodiment of the invention, illustrating a composite disconnect fitting with integral bypass lines configured in accordance with an embodiment of the invention.

FIG. 3 illustrates an embodiment of a composite disconnect fitting 300 including at least one bypass line. First inflow line 305 enters a first inflow valve 310 which diverts flow between inflow disconnect fitting line 315 and inflow bypass line 320. Second inflow valve 325 directs flow from inflow disconnect fitting line 315 and bypass line 330 to second inflow line 335. First outflow line 340 enters a first outflow valve 345 which diverts flow between disconnect fitting line 350 and bypass line 330. Second outflow valve 355 directs flow from outflow disconnect fitting line 350 and bypass line 320 to second outflow line 360. In multiple embodiments, the fitting may be a single unit or a composite assembly of components. The fitting supports automatic shunting of fluid via multiple paths, permitting continued fluid flow when connectors are separated, simultaneously opening and blocking fluid paths. A further aspect can limit or prevent the leakage of fluid upon disconnection and connection.

Figure 4:
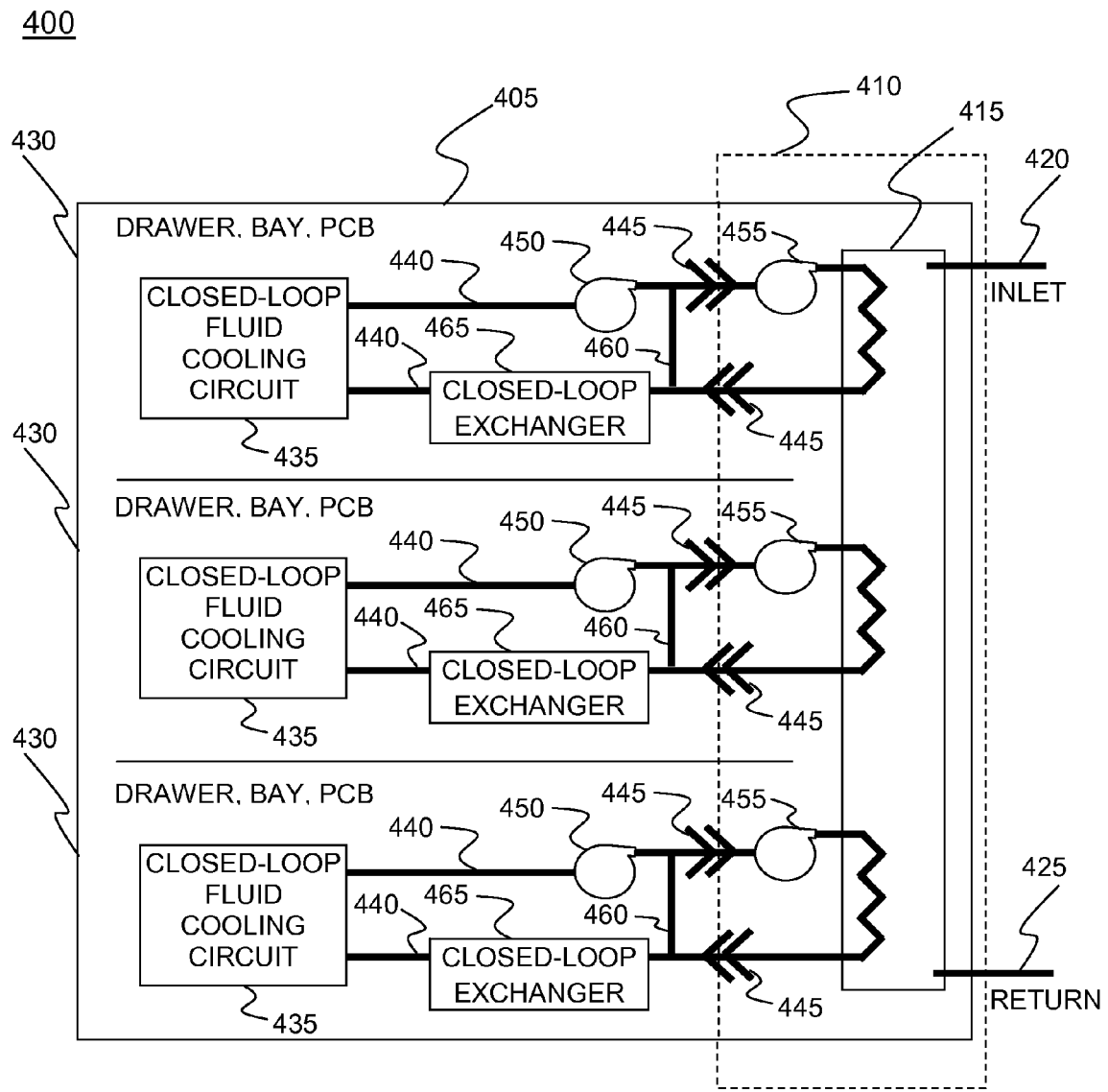
FIG. 4 is a representative schematic diagram of one embodiment of the invention, illustrating a three bay electronics cabinet, each bay of which is configured with a closed-loop fluid cooling circuit connected via quick-disconnects to a liquid/liquid heat exchanger and closed, master cooling circuit, each loop being configured with a bypass, pump, and fluid/air heat exchanger for temporary cooling when disconnected from the liquid/liquid heat exchanger. Loops can be a single or two phase loop, optionally using a compressor instead of a pump.

FIG. 4 illustrates an embodiment of an electrical cabinet 405 with a hinged back panel 410 to which is attached a liquid/liquid heat exchanger 415, with a master coolant inlet 420 and return 425. In other embodiments, heat exchanger 415 may be liquid to air, where room air or ducted air is used to cool the liquid. The cabinet contains multiple drawers, bays, modules, printed circuit boards or components 430 which are cooled by respective closed-loop fluid cooling circuits 435, which are connected by their respective fluid lines 440 and quick-disconnect fittings 445 to respective heat delivery coils in heat exchanger 415. Circulation of coolant in each closed-loop cooling circuit is accomplished by pump 450, on the inboard or cooling circuit side of the quick-disconnect fittings 445, for reasons explained below. There may be an optional or alternative coolant pump 455 in the cooling circuit on the outboard side of quick-disconnect fittings 445. Three components 430 are depicted, one, two, or more than three are included in embodiments.

In various embodiments, there are equipment drawers or bays, or electronic modules, printed circuit boards or components 430 that may be variously configured to remain powered while being opened or partially removed, or may require being powered down for full opening or removal, or may be disconnected from power, such as being literally unplugged, by being opened or removed. Also, back panel 410 may be opened for access to the interior, such as by being swung open on hinges, with or without power being removed from the cabinet or from respective components 430.

According to various embodiments of the invention, partial or full opening or removal of any component 430, or opening of back panel 410, will disconnect respective or all service cooling loop fluid lines from their respective heat delivery coils in liquid/liquid heat exchanger 415. The quick-disconnect fittings 445 are also configured for quickly closing both ends of each disconnected fluid line to stop outflow of coolant when a cooling circuit is disconnected from its heat delivery coil in liquid/liquid heat exchanger 415, so that little or no fluid is lost from either side of the cooling circuit. The restoration of full engagement of component 430 into its place in the cabinet, in addition to or along with the closing of back panel 410, causes a reconnection of quick-disconnects 445, whereby fluid flow is restored to the full path of the respective cooling circuits through heat exchanger 415.

Of interest is the case of a cooling circuit being disconnected from heat exchanger 415 by opening of the back panel or partial removal of one component 430 while another component is still being powered and is functional for its primary purpose. Accordingly, fluid lines 440 for each fluid cooling circuit 435 are connected just inboard of the quick-disconnect fittings 445 by a fluid bypass line 460, through which cooling fluid is shunted when the quick-disconnects are open. Fluid flow in the cooling circuit is maintained through bypass line 460, if power is still available, by fluid cooling circuit pump 450. A closed-loop fluid/air heat exchanger 465 in a line 440 provides for an air to fluid heat exchange, cooling the air when the cooling circuit is fully functional to help maintain cabinet air temperatures; but functions in reverse to provide limited temporary cooling of the component by having the heat exchanger running from fluid to air, using the ambient cabinet air for cooling, when the bypass line is being used.

The invention is susceptible of other embodiments. For example, there is a two-stage fluid cooling system for an electronics cabinet comprising at least one closed-loop fluid cooling circuit serving an electronic component in the cabinet and transferring its heat to a host coolant conditioning system via a fluid-fluid heat exchanger. The term "cooling" means the transfer of thermal energy to or from a component for which a stable operating temperature range is desired. The term "fluid" here refers to any useful gas or liquid coolant used in a single or multi-phase cooling cycle. The term "electronic component" can be interpreted to mean any of a heat generating drawer, bay, module, circuit board or component within the electronics cabinet. The closed-loop fluid cooling circuit is configured with a thermally conductive cooling interface to the electronic component, which can be or include, for example, any known thermal interface between a closed-loop cooling circuit and the subject component, including a fluid to air exchange with air circulated over a heat sink, or a fluid cool plate, or internal fluid flow or air flow cavities, or combinations or variants of these. There is at least one fluid pump or compressor for circulating coolant in the cooling circuit.

In embodiments, supply and return fluid flow lines of the fluid cooling circuit are connected by quick-disconnect line fittings to a respective heat delivery coil in a fluid-fluid cabinet heat exchanger. Each quick-disconnect line fitting is associated with a cooling circuit line end or a heat delivery coil line end, and each fitting interpreted to be configured with a switchable shut off valve for closing its associated line end to fluid flow upon disconnecting and opening the associated line end to fluid flow upon reconnecting.

Embodiments of the fluid cooling circuit are further configured with a bypass line connecting the supply and return fluid flow lines at points inboard of the quick-disconnect fittings such that a disconnect and closure of the line ends causes fluid flow in the truncated cooling circuit to be rerouted through the bypass line.

The cabinet heat exchanger may be arranged proximate the backside of the electronics cabinet so as to be movable for providing access to the cabinet interior. It may be attached to a conventional back panel and swing open with the panel on back panel hinges along one side of the cabinet. The cabinet heat exchanger is configured with inlet and return coolant fluid connections connectable by flexible lines or hoses to a host coolant fluid conditioning system.

Other and various embodiments will be readily apparent to those skilled in the art, from this description, figures, and the claims that follow.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A cooling system for an electronics cabinet comprising:
    at least one fluid closed-loop cooling circuit serving at least one heat generating component within an electronics cabinet;
    a closed-loop heat exchanger in said at least one closed-loop cooling circuit;
    a fluid-fluid heat exchanger in a host cooling circuit;
    said fluid-fluid heat exchanger connected by quick-disconnect fittings to said at least one closed-loop cooling circuit, said fluid-fluid heat exchanger supporting heat transfer between fluid of said at least one closed-loop cooling circuit and said host cooling circuit; and
    supply and return fluid flow lines connected to said fluid-fluid heat exchanger through which cooling fluid is shunted through only said at least one closed-loop cooling circuit only when said quick-disconnect fittings are open, wherein cooling fluid is shunted through a bypass line when said quick-disconnect fittings are open, whereby fluid flow in said closed-loop cooling circuit is maintained, said shunting comprising first and second inflow valves, first and second outflow valves, and input and output bypass lines, whereby alternate flow paths are employed when said quick-disconnect fittings are open and closed.

2. The system of claim 1, wherein said at least one closed-loop cooling circuit uses a two phase coolant.

3. The system of claim 1, wherein said at least one closed-loop cooling circuit is configured with a thermally conductive interface with said at least one heat generating component and with supply and return fluid flow lines.

4. The system of claim 1, wherein said cooling system comprises at least one fluid pump.

5. The system of claim 1, wherein said cooling system comprises a compressor.

6. The system of claim 1, wherein each said quick-disconnect fitting is associated with one closed-loop cooling circuit line end and a host cooling circuit line end, each said quick-disconnect fitting configured for closing its associated line end to fluid flow upon disconnecting and opening the associated line end to fluid flow upon reconnecting.

7. The system of claim 1, wherein said fluid-fluid heat exchanger of said host cooling circuit is arranged proximate a back side of said electronics cabinet so as to be movable for providing access to interior of said cabinet between a first position at least partially obscuring said access to said interior and a second position sufficiently distant from said electronics cabinet as to provide said access to said interior of said cabinet.

8. The system of claim 1, wherein said quick-disconnect fittings are arranged such that front removal of said at least one heat generating component operates to disconnect said host cooling circuit from said at least one closed-loop cooling circuit.

9. The system of claim 1, wherein said quick-disconnect fittings are arranged such that moving of said fluid-fluid heat exchanger operates to disconnect said host cooling circuit from said at least one closed-loop cooling circuit.

10. The system of claim 1, wherein said quick-disconnect fittings are arranged such that either of front removal of said at least one heat generating component or moving of said fluid-fluid heat exchanger operates to disconnect said host cooling circuit from said at least one closed-loop cooling circuit.

11. The system of claim 1, wherein each of said at least one closed-loop cooling circuits comprises a closed-loop heat exchanger.

12. The system of claim 1, wherein one said closed-loop heat exchanger serves multiple said at least one closed-loop cooling circuits, wherein said closed-loop heat exchanger is connected to said multiple closed loop circuits via fluid coupling.

13. The system of claim 1, wherein said closed-loop heat exchanger cools fluid passing through said closed-loop heat exchanger when ambient cabinet air is cooler than said fluid and cools said ambient cabinet air when said fluid is cooler than said ambient air.

14. The system of claim 1, wherein said quick-disconnect fitting limits or prevents leakage of fluid upon disconnection and connection.

15. A method for cooling an electronics cabinet, the method comprising:
    providing a heat exchange assembly configured to cool at least one heat generating component and wherein said heat exchange assembly comprises:
    at least one fluid closed-loop cooling circuit serving said at least one heat generating component within an electronics cabinet;
    a closed-loop heat exchanger in said at least one closed-loop cooling circuit;
    a fluid-fluid heat exchanger in a host cooling circuit;
    said fluid-fluid heat exchanger connected by quick-disconnect fittings to said at least one closed-loop cooling circuit, said fluid-fluid heat exchanger supporting heat transfer between fluid of said at least one closed-loop cooling circuit and said host cooling circuit;
    supply and return fluid flow lines connected to said fluid-fluid heat exchanger through which cooling fluid is shunted through only said at least one closed-loop cooling circuit only when said quick-disconnect fittings are open; and
    wherein when in operation, said closed-loop cooling circuit functions after disconnection of said fluid-fluid heat exchanger thereby providing cooling to said at least one heat generating component, wherein cooling fluid is shunted through a bypass line when said quick-disconnect fittings are open, whereby fluid flow in said closed-loop cooling circuit is maintained, said shunting comprising first and second inflow valves, first and second outflow valves, and input and output bypass lines, whereby alternate flow paths are employed when said quick-disconnect fittings are open and closed.

16. The method of claim 15, wherein each said quick-disconnect fitting is associated with a closed-loop cooling circuit line end and a host cooling circuit line end, each said quick-disconnect fitting closing its associated line end to fluid flow upon disconnecting and opening said associated line end to fluid flow upon reconnecting.

17. The method of claim 15, wherein said quick-disconnect fittings are arranged such that either of front removal of said at least one heat generating component or moving of said fluid-fluid heat exchanger operates to disconnect said host cooling circuit from said at least one closed-loop cooling circuit.

18. The method of claim 15, wherein said fluid-fluid heat exchanger of said host cooling circuit is arranged proximate a back side of said electronics cabinet so as to be movable for providing access to interior of said cabinet between a first position at least partially obscuring said access to said interior and a second position sufficiently distant from said electronics cabinet as to provide said access to said interior of said cabinet.

* * * * *